(12) United States Patent
Du et al.

(10) Patent No.: US 12,101,943 B2
(45) Date of Patent: Sep. 24, 2024

(54) SEMICONDUCTOR STRUCTURE AND FABRICATION METHOD THEREOF

(71) Applicant: Changxin Memory Technologies, Inc., Anhui (CN)

(72) Inventors: Qingsong Du, Hefei (CN); Wei Chang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 401 days.

(21) Appl. No.: 17/725,742

(22) Filed: Apr. 21, 2022

(65) Prior Publication Data

US 2023/0209840 A1   Jun. 29, 2023

(30) Foreign Application Priority Data

Dec. 29, 2021   (CN) .......................... 202111640340.7

(51) Int. Cl.
  *H10B 63/00* (2023.01)
  *H10N 70/00* (2023.01)
  *H10N 70/20* (2023.01)

(52) U.S. Cl.
  CPC .......... *H10B 63/30* (2023.02); *H10N 70/011* (2023.02); *H10N 70/253* (2023.02); *H10N 70/8265* (2023.02)

(58) Field of Classification Search
  CPC .... H10B 63/30; H10N 70/011; H10N 70/253; H10N 70/8265; H10N 70/066; H10N 70/20; H10N 70/8833
  See application file for complete search history.

(56) References Cited

U.S. PATENT DOCUMENTS

| | | | |
|---|---|---|---|
| 11,957,067 B2* | 4/2024 | Boivin | H10N 70/826 |
| 2007/0254428 A1* | 11/2007 | Willer | H10N 70/881 |
| | | | 257/296 |
| 2020/0152754 A1* | 5/2020 | Kim | H01L 29/511 |
| 2021/0280779 A1* | 9/2021 | Boivin | H10N 70/061 |

OTHER PUBLICATIONS

H. W. Pan et al., "1Kbit FinFET Dielectric (FIND) RRAM in pure 16nm FinFET CMOS logic process," 2015 IEEE. International Electron Devices Meeting (IEDM), Washington, DC, USA, 2015, pp. 10.5.1-10.5.4, doi: 10.1109/IEDM.2015.7409670.

* cited by examiner

*Primary Examiner* — J. E. Schoenholtz
(74) *Attorney, Agent, or Firm* — Sheppard Mullin Richter & Hampton LLP (57) ABSTRACT

A semiconductor structure and the fabrication method thereof are provided. The semiconductor structure includes: a substrate including a first doped region and a second doped region; a first selection transistor and a second selection transistor located in the substrate; a conductive layer located between the first doped region and the second doped region; a resistive dielectric layer located on sidewalls of the conductive layer, where the conductive layer, the first doped region, and a portion of the resistive dielectric layer facing the first doped region constitute a first variable resistor, and the conductive layer, the second doped region, and a portion of the resistive dielectric layer facing the second doped region constitute a second variable resistor; and an isolation dielectric layer located between the conductive layer and the substrate. The semiconductor structure improves the storage density of resistive random access memory (RRAM).

19 Claims, 4 Drawing Sheets

SEMICONDUCTOR STRUCTURE AND FABRICATION METHOD THEREOF

CROSS-REFERENCE TO RELATED APPLICATION

This application claims priority to Chinese Patent Application No.: 202111640340.7, filed on Dec. 29, 2021, entitled "SEMICONDUCTOR STRUCTURE AND FABRICATION METHOD THEREOF". The above-referenced application is incorporated herein by reference in its entirety.

TECHNICAL FIELD

Embodiments of the invention generally relate to semiconductors and, more particularly, to a semiconductor structure and a fabrication method thereof.

BACKGROUND

Resistive random access memory (RRAM) is a nonvolatile memory based on reversible conversion between a high-resistance state and a low-resistance state of the dielectric material under the external electric field. An RRAM generally has a metal-insulator-metal (MIM) structure, consisting of an upper electrode, a resistive dielectric layer, and a lower electrode in sequence from top to bottom. Therefore, the MIM structure has a relatively large size.

However, with the rapid development of integrated circuit technologies, there are increasing demands for higher storage capacity and smaller physical dimensions of the memory. Therefore, increasing the storage density of an RRAM has become an urgent problem to be solved.

SUMMARY

The embodiments of the invention provide a semiconductor structure and a fabrication method thereof to increase the storage density of an RRAM.

One aspect of the invention is directed to a semiconductor structure. The semiconductor structure may include: a substrate including a first doped region and a second doped region; a first selection transistor and a second selection transistor located in the substrate; a conductive layer located between the first doped region and the second doped region; a resistive dielectric layer located on sidewalls of the conductive layer, wherein the resistive dielectric layer includes a first portion facing the first doped region and a second portion facing the second doped region, and wherein the conductive layer, the first doped region, and the first portion of the resistive dielectric layer constitute a first variable resistor, and the conductive layer, the second doped region, and the second portion of the resistive dielectric layer constitute a second variable resistor; and an isolation dielectric layer located between the conductive layer and the substrate.

Another aspect of the invention is directed to a semiconductor structure fabrication method. The fabrication method may include: providing a substrate; forming a first doped region and a second doped region within the substrate; forming a first selection transistor and a second selection transistor within the substrate; forming a conductive layer located between the first doped region and the second doped region; forming a resistive dielectric layer located on sidewalls of the conductive layer, wherein the resistive dielectric layer includes a first portion facing the first doped region and a second portion facing the second doped region, and wherein the conductive layer, the first doped region, and the first portion of the resistive dielectric layer constitute a first variable resistor, and the conductive layer, the second doped region and the second portion of the resistive dielectric layer constitute a second variable resistor; and forming an isolation dielectric layer located between the conductive layer and the substrate.

In the technical solutions of the semiconductor structure provided in the embodiments of the invention, the semiconductor structure may include: a substrate including a first doped region and a second doped region; a first selection transistor and a second selection transistor located in the substrate; a conductive layer located between the first doped region and the second doped region; and a resistive dielectric layer located on sidewalls of the conductive layer. The conductive layer, the first doped region, and a portion of the resistive dielectric layer facing the first doped region constitute a first variable resistor, and the conductive layer, the second doped region, and a portion of the resistive dielectric layer facing the second doped region constitute a second variable resistor. The semiconductor structure may further include an isolation dielectric layer located between the conductive layer and the substrate.

BRIEF DESCRIPTION OF THE DRAWINGS

One or more embodiments are illustratively described with reference to the accompanying drawings. These exemplary descriptions do not constitute a limitation on the embodiments. Unless otherwise stated, the accompanying drawings do not constitute a limitation on the scale. To describe technical solutions in the embodiments of the invention or in the conventional technology clearly, the accompanying drawings of the embodiments of the invention are briefly described in the following. Apparently, the accompanying drawings in the following description only illustrate some embodiments of the invention, and persons of ordinary skills in the art may derive other drawings from these accompanying drawings without creative efforts.

DETAILED DESCRIPTION OF EMBODIMENTS

As explained in the Background section, the existing semiconductor structures of the RRAM have a low storage density.

One of the reasons for the low storage density of the RRAM is that the RRAM consists of a transistor and a MIM structure. The MIM structure consists of an upper electrode, a resistive dielectric layer, and a lower electrode, resulting in a relatively large size. Compared with a dynamic random access memory (DRAM), the number of RRAM cells per unit area is smaller (i.e., the RRAM has a lower integration level), causing a relatively low storage density of the RRAM. In addition, one semiconductor structure currently has only one semiconductor unit, and can only store one bit of data, which further limits the storage density of the RRAM.

A semiconductor structure provided in an embodiment of the invention may include: a substrate, the substrate including a first doped region and a second doped region; a first selection transistor and a second selection transistor located in the substrate; a conductive layer located between the first doped region and the second doped region; and a resistive dielectric layer. The conductive layer, the first doped region, and a portion of the resistive dielectric layer facing the first doped region constitute a first variable resistor, and the conductive layer, the second doped region, and a portion of the resistive dielectric layer facing the second doped region constitute a second variable resistor. The semiconductor structure may further include an isolation dielectric layer located between the conductive layer and the substrate. The first variable resistor and the second variable resistor share the same conductive layer, such that the semiconductor structure can have a relatively small size. In addition, the first variable resistor and the first selection transistor, and the second variable resistor and the second selection transistor each constitute a semiconductor unit. Thus, one semiconductor structure can store multiple bits of data, increasing the storage density of the memory with such a semiconductor structure.

Various embodiments of the invention are described in detail below with reference to the accompanying drawings. Persons of ordinary skills in the art can appreciate that many technical details are set forth in various embodiments of the invention for the reader to better understand the invention. However, the technical solutions claimed in the invention can be implemented without resorting to some or all of the technical details and various changes and modifications disclosed in the following embodiments.

Figure 1:
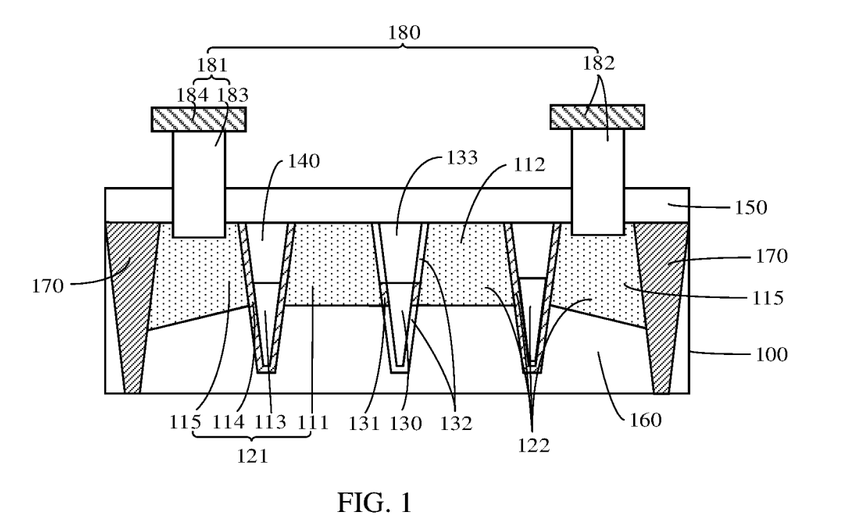
FIG. 1 is a schematic structural diagram of a cross-sectional view of a semiconductor structure according to an embodiment of the invention.

FIG. 1 is a schematic structural diagram of a cross-sectional view of a semiconductor structure according to an embodiment of the invention. Referring to FIG. 1, the semiconductor structure may include: a substrate 100, the substrate including a first doped region 111 and a second doped region 112; a first selection transistor 121 and a second selection transistor 122. The first selection transistor 121 and the second selection transistor 122 may be located in the substrate 100. The semiconductor structure may further include a conductive layer 130 located between the first doped region 111 and the second doped region 112; a resistive dielectric layer 131; and an isolation dielectric layer 132 located between the conductive layer 130 and the substrate 100. The conductive layer 130, the first doped region 111, and a portion of the resistive dielectric layer 131 facing the first doped region 111 (i.e., the first portion of the resistive dielectric layer 131) may constitute the first variable resistor. The conductive layer 130, the second doped region 112, and a portion of the resistive dielectric layer 131 facing the second doped region 112 (i.e., the second portion of the resistive dielectric layer 131) may constitute the second variable resistor.

The first doped region 111 and the second doped region 112 within the substrate 100 are used as one electrode of a variable resistor, and the conductive layer 130 is used as the other electrode of the variable resistor, such that the first doped region 111 and the second doped region 112 constitute the first variable resistor and the second variable resistor, respectively, together with the resistive portion of the dielectric layer 131 and the conductive layer 130. The first variable resistor and the second variable resistor may share the conductive layer 130. By fully utilizing the structure within the substrate 100 to constitute the MIM structures, there is no need to separately form an upper electrode, a resistive dielectric layer 131, and a lower electrode, such that the semiconductor structure has a relatively small size. The first variable resistor and the first selection transistor 121 constitute a semiconductor unit, and the second variable resistor and the second selection transistor 122 constitute another semiconductor unit. Thus, one semiconductor structure can store multiple bits of data. When such a semiconductor structure is fabricated into memory, the storage density of the memory is increased.

In some embodiments, the material of the substrate 100 is a semiconductor material. In some embodiments, the material of the substrate 100 is silicon. In some other embodiments, the substrate 100 may be a germanium substrate, a silicon-germanium substrate, a silicon carbide substrate, or a silicon-on-insulator substrate.

The first doped region 111 and the second doped region 112 may be used as one of the source or the drain of the first selection transistor 121 and the second selection transistor 122 to constitute the first selection transistor 121 and the second selection transistor 122. The first doped region 111 and the second doped region 112 may also be used as one electrode of the first variable resistor or the second variable resistor. Thus, there is no need to separately form an electrode for the first variable resistor or the second variable resistor, reducing the size of the semiconductor structure and increasing the storage density of the memory with such a semiconductor structure. In addition, the fabrication process of forming the first variable resistor and the second variable resistor may be simplified by using the existing components in the semiconductor structure to constitute the first variable resistor and the second variable resistor.

In some embodiments, the change of the resistance of the variable resistor from a high-resistance state to a low-resistance state is referred to as the "set '1'" process, and the change from a low-resistance state to a high-resistance state is referred to as the "set '0'" process. In some embodiments, when the first selection transistor 121 is selected, the first variable resistor is selected. When a write voltage is applied to the first variable resistor to perform the "set '1'" or "set '0'" process on the first variable resistor, data of the first variable resistor may be read out via a bit line (not shown in the drawings) arranged on one side surface of the substrate 100 and connected to the conductive layer 130. Similarly, when the second selection transistor 122 is selected, the second variable resistor is selected. When performing the "set '1'" or "set '0'" process on the second variable resistor, data of the second variable resistor may be read out via the bit line. In some embodiments, the data storage process may be completed by performing the "set '1'" process on the first variable resistor and the second variable resistor. In some other embodiments, the data storage process may be completed by performing the "set '0'" process on the first variable resistor and the second variable resistor.

In some embodiments, the first doped region 111 and the second doped region 112 are doped with the same type of dopant ions. For example, the first doped region 111 and the second doped region 112 may be both doped with P-type ions or N-type ions. Specifically, the P-type ions may be at least one of boron ions, indium ions, or gallium ions, and the N-type ions may be at least one of arsenic ions, phosphorus ions, or antimony ions. In some embodiments, the doping concentration of the dopant ions of the first doped region 111 may be the same as that of the dopant ions of the second doped region 112. Thus, in the process of forming the first doped region 111 and the second doped region 112, the first doped region 111 and the second doped region 112 can be integrally formed, which simplifies the fabrication process. In addition, the characteristics of the first variable resistor, including the first doped region 111, may be similar or identical to the characteristics of the second variable resistor, including the second doped region 112, when the dopant ion concentration of the first doped region 111 is the same as that of the second doped region 112. In addition, when the first variable resistor and the first selection transistor 121, and the second variable resistor and the second selection transistor 122 constitute two semiconductor units, respectively, data write and read rates of the two semiconductor units may be similar or identical, and data write and read rates of various circuits in the memory may be relatively uniform, which improves the performance of the memory. In some other embodiments, the dopant ion concentration of the first doped region 111 may be different from that of the second doped region 112.

In some embodiments, the resistive dielectric layer 131 may be located only on the sidewall of a portion of the conductive layer 130 corresponding to the first doped region 111 and the second doped region 112. The isolation dielectric layer 132 may be arranged on the sidewall of the remaining portion of the conductive layer 130 to isolate the remaining portion of the conductive layer 130 from the first doped region 111 and the second doped region 112.

In some embodiments, the resistive dielectric layer 131 and the isolation dielectric layer 132 may be made of different materials. In some embodiments, the resistive dielectric layer 131 may be made of a high-K dielectric material, for example, a material with the K value greater than 3.9. Specifically, the resistive dielectric layer 131 may be made of any one of $HfO_2$, $Ta_2O_5$, $Al_2O_3$, or MgO, and the specific material of the resistive dielectric layer 131 is not limited in the embodiments of the invention. Using a high-K dielectric material for the resistive dielectric layer 131 provides good electrical insulation and stable chemical and physical properties. In addition, due to good resistance adjustability (i.e., the adjustability of the resistance under an external electric field) of hafnium oxide, the first variable resistor and the second variable resistor have good resistance adjustability, thereby improving the performance of the memory. In addition, good interface characteristics between hafnium oxide and the silicon substrate 100 also contribute to the good performance of the semiconductor structure. In some embodiments, the isolation dielectric layer 132 may be made of at least one of silicon oxide, silicon nitride, or silicon oxynitride.

Figure 2:
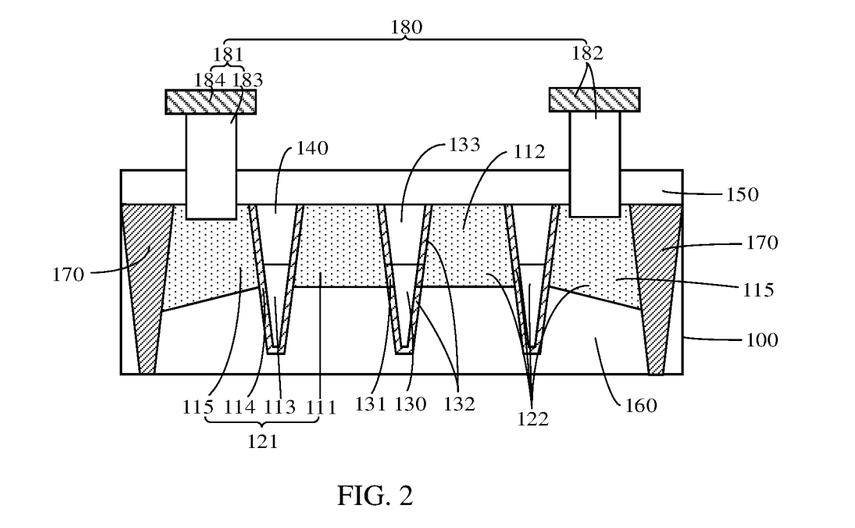
FIG. 2 is another schematic structural diagram of a cross-sectional view of a semiconductor structure according to an embodiment of the invention.

FIG. 2 is another schematic structural diagram of a cross-sectional view of a semiconductor structure according to an embodiment of the invention. Referring to FIG. 2, in some embodiments, the isolation dielectric layer 132 and the resistive dielectric layer 131 may be integrally formed film layers. In this invention, two or more layers are "integrally formed" means these layers are made of the same material and formed in the same process. Thus, the isolation dielectric layer 132 and the resistive dielectric layer 131 may be made of the same material, and formed in the same process, which simplifies the fabrication process for the resistive dielectric layer 131 and the isolation dielectric layer 132.

In some embodiments, the top surface of the conductive layer 130 may be lower than the top surface of the first doped region 111 and the top surface of the second doped region 112. The semiconductor structure may further include a cap layer 133 located on the top surface of the conductive layer 130 and within the substrate 100. The resistive dielectric layer 131 may be further located on a side surface of the cap layer 133 facing the first doped region 111 and a side surface of the cap layer 133 facing the second doped region 112. In other words, the conductive layer 130 may be a buried structure, such that the semiconductor structure has a relatively small size. The cap layer 133 is configured to protect the conductive layer 130. Specifically, the cap layer 133 may be made of either silicon oxide or silicon nitride. The resistive dielectric layer 131 may be located on the side surface of the cap layer 133. As such, when forming the resistive dielectric layer 131 and the isolation dielectric layer 132, the resistive dielectric layer 131 on the side surface of the cap layer 133 can be simultaneously formed, which simplifies the fabrication process. In addition, when forming the cap layer 133 and the resistive dielectric layer 131 on the side surface of the cap layer 133, the resistive dielectric layer 131 is usually formed before the cap layer 133. Thus, when forming the cap layer 133 subsequently, the first doped region 111 and the second doped region 112 facing the cap layer 133 can be protected from fabrication damage.

In some other embodiments, the top surface of the conductive layer 130 may alternatively be flush with the top surface of the first doped region 111 and the top surface of the second doped region 112. In still other embodiments, the top surface of the conductive layer 130 may alternatively be higher than the top surface of the first doped region 111 and the top surface of the second doped region 112.

In some embodiments, the portion of the resistive dielectric layer 131 facing the first doped region 111 may be in contact with the first doped region 111, and the portion of the resistive dielectric layer 131 facing the second doped region 112 may be in contact with the second doped region 112. In other words, the resistive dielectric layer 131 is in direct contact with the first doped region 111 and the second doped region 112. Thus, in the process of forming the resistive dielectric layer 131, after the substrate 100 is etched to form a trench for accommodating the resistive dielectric layer 131 and the conductive layer 130, the resistive dielectric layer 131 can be directly formed in the trench, which simplifies the fabrication process.

In some embodiments, the thickness of the resistive dielectric layer 131 ranges from 2 nm to 10 nm. When a selection transistor is switched on to apply a forward voltage to the variable resistor, if the resistive dielectric layer 131 is too thin, there may be fewer conductive impurities generated in the resistive dielectric layer 131, and there may also be fewer conductive impurities that can be connected, such that the desired low-resistance state may not be achieved. By setting the thickness of the resistive dielectric layer 131 within this thickness range, on the one hand, the resistive dielectric layer 131 is not too thin to jeopardize the resistive characteristics, and the relatively thick resistive dielectric layer 131 may reduce the leakage currents of the first variable resistor and the second variable resistor; on the other hand, the resistive dielectric layer 131 is not too thick to unnecessarily increase the size of the semiconductor structure.

In some embodiments, along the direction perpendicular to the surface of the substrate 100, the length of the conductive layer 130 in contact with the resistive dielectric layer 131 ranges from 5 nm to 40 nm. The length of the conductive layer 130 in contact with the resistive dielectric layer 131 refers to the length of the conductive layer 130 for forming the first variable resistor and the second variable resistor. By setting the length of the conductive layer 130 in contact with the resistive dielectric layer 131 within this range, on the one hand, the resistive dielectric layer 131 has a relatively large size in contact with the conductive layer 130. Therefore, when the selection transistor is switched on to apply a forward voltage to the variable resistor, more conductive impurities may be generated in the resistive dielectric layer 131 to form a conductive path, so as to achieve the effect of a low-resistance state and good resistive characteristics of the first variable resistor and the second variable resistor; on the other hand, the length of the conductive layer 130 in contact with the resistive dielectric layer 131 is not too large, so that relatively small size of the semiconductor structure can be maintained.

In some embodiments, along the direction of the first selection transistor 121 pointing to the conductive layer 130, the distance from the conductive layer 130 to the first selection transistor 121 may be substantially equal to the distance from the conductive layer 130 to the second selection transistor 122. In other words, the first doped region 111 and the second doped region 112 on both sides of the conductive layer 130 have substantially the same size. For example, the two distances may be considered "substantially equal" to each other when the difference between these two distances is less than 5% of the larger distance.

When the selection transistor is switched on such that a carrier moves from the source or drain of the selection transistor to the resistive dielectric layer 131, transmission paths of the carrier to the resistive dielectric layer 131 in the first doped region 111 and to the resistive dielectric layer 131 in the second doped region 112, respectively, are similar or identical. Thus, the characteristics of the two semiconductor units located in the same semiconductor structure are similar or identical. For example, the data write and read rates of the semiconductor units may be similar or identical. When such a semiconductor structure is fabricated into memory, data write and read rates of various circuits in the memory are relatively uniform, which improves the performance of the memory.

In some embodiments, the first selection transistor 121 and the second selection transistor 122 may each include a word line 113 located in the substrate 100. The word line 113 and the conductive layer 130 may be in the same layer and are made of the same material. The word line 113 may be a buried word line 113. By setting the word line 113 and the conductive layer 130 to be in the same layer and made of the same material, the conductive layer 130 can be formed in the same process of forming the word line 113 and the conductive layer 130. In other words, the conductive layer 130 can be formed in the process of forming the word line 113, and there is no need to separately form an electrode of the variable resistor, which greatly simplifies the fabrication process of forming the variable resistor. In some embodiments, the word line 113 and the conductive layer 130 may be made of at least one of a titanium nitride material, a metal titanium material, a metal tungsten material, and a doped polysilicon material.

In some embodiments, the first selection transistor 121 and the second selection transistor 122 may each further include a gate dielectric layer 114 located on the sidewall and the bottom of the word line 113. The gate dielectric layer 114 and the resistive dielectric layer 131 may be made of the same material. The gate dielectric layer 114 may be located on the sidewall and the bottom of the word line 113 to isolate the word line 113 from the substrate 100, thereby preventing ions in the word line 113 and the substrate 100 from diffusing into each other. Moreover, the gate dielectric layer 114 may reduce the leakage current. In addition, the gate dielectric layer 114 covering the sidewall and the bottom of the word line 113 may protect the substrate 100 from being damaged in the fabrication process, which improves the electrical characteristics of the semiconductor structure. By using the same material for the gate dielectric layer 114 and the resistive dielectric layer 131, the gate dielectric layer 114 and the resistive dielectric layer 131 may be formed simultaneously in the same process. An RRAM can be fabricated using a mask of a DRAM semiconductor structure to simultaneously form the resistive dielectric layer 131 and the gate dielectric layer 114, which simplifies the fabrication process of the resistive dielectric layer 131.

In some embodiments, the semiconductor structure may further include a word line cap layer 140. The word line cap layer 140 may be located on the top surface of the word line 113 and within the substrate 100, and may be configured to protect the word line 113. In some embodiments, the word line cap layer 140 may be made of the same material as the cap layer 133. Thus, the word line cap layer 140 and the cap layer 133 may be formed simultaneously in the same process. In some embodiments, the word line cap layer 140 and the cap layer 133 may both be made of either silicon oxide or silicon nitride.

In some embodiments, the semiconductor structure may further include a dielectric layer 150 that covers the surface of the substrate 100 and is in contact with the word line cap layer 140 and the cap layer 133. In some embodiments, the dielectric layer 150 may be made of one or more of oxide, nitride, or oxynitride.

In some embodiments, the substrate 100 may further include a well layer 160 located beneath the first doped region 111 and the bottom of the second doped region 112. The type of dopant ions in the well layer 160 may be different from the type of dopant ions in the first doped region 111 and the second doped region 112. A portion of the conductive layer 130 may be further located in the well layer 160, and the isolation dielectric layer 132 may be located between the well layer 160 and the conductive layer 130. A portion of the conductive layer 130 may be located in the well layer 160, such that the resistive dielectric layers 131 located on the sidewalls of the conductive layer 130 of the first doped region 111 and the second doped region 112 are not connected to each other in doped regions having the same type of dopant ions. Therefore, a portion of the resistive dielectric layer 131 facing the first doped region 111 may be used as a portion of the first variable resistor, and a portion of the resistive dielectric layer 131 facing the second doped region 112 may be used as a portion of the second variable resistor. Thus, the resistive dielectric layer 131 can be arranged only on the sidewall of the conductive layer 130 in the substrate 100. By using the first doped region 111 and the second doped region 112 within the substrate 100 as one electrode of the variable resistor, and using the conductive layer 130 as the other electrode of the variable resistor, the first variable resistor and the second variable resistor can be formed, respectively. Thus, two semiconductor units can be formed in one semiconductor structure, facilitating the miniaturization of the semiconductor structure.

In some embodiments, dopant ions in the well layer 160 may be P-type ions or N-type ions. The type of dopant ions in the well layer 160 may be different from the type of dopant ions in the first doped region 111 and the second doped region 112, such that PN junctions can be formed between the well layer 160 and each of the first doped region 111 and the second doped region 112.

In some embodiments, the semiconductor structure may further include a bit line (not shown in the drawings) electrically connected to the conductive layer 130 to draw out an electrical signal of the conductive layer 130.

In some other embodiments, the conductive layer 130 may alternatively be located only in the first doped region 111 and the second doped region 112. This is because in the process of forming the conductive layer 130 and the resistive dielectric layer 131, a trench needs to be first formed in the substrate 100 before the resistive dielectric layer 131 and the conductive layer 130 are formed in the trench. Therefore, as long as a portion of the trench is located in the well layer 160, even though the conductive layer 130 is located only in the first doped region 111 and the second doped region 112, the resistive dielectric layers 131 located on the sidewall of the conductive layer 130 of the first doped region 111 and the second doped region 112 are still not connected to each other in doped regions having the same type of dopant ions.

In some embodiments, the semiconductor structure may further include: two third doped regions 115 located in the substrate 100 and an electrical connection structure 180 in contact with the third doped regions 115. One of the third doped regions 115 may be one of the source or drain of the first selection transistor 121, and the other one of the third doped regions 115 may be the other one of the source or drain of the second selection transistor 122. In some embodiments, the third doped region 115 located on the side of the first doped region 111 away from the resistive dielectric layer 131, the gate dielectric layer 114, the word line 113, and the first doped region 111 may constitute the first selection transistor 121, and the third doped region 115 located on the side of the second doped region 112 away from the resistive dielectric layer 131, the gate dielectric layer, the word line, and the second doped region 112 may constitute the second selection transistor 122.

In some embodiments, the type of dopant ions in the third doped region 115 may be the same as that of dopant ions in the first doped region 111 and the second doped region 112. When the word line 113 is selected, conductive trenches may be formed between the first doped region 111 and the third doped region 115 and between the second doped region 112 and the third doped region 115, respectively, so as to switch on the first selection transistor 121 and the second selection transistor 122, respectively, to select the first variable resistor and the second variable resistor, respectively.

The electrical connection structure 180 may be in contact with the substrate 100 of the third doped region 115 and may be configured to read out an electrical signal of the third doped region 115. In some embodiments, the electrical connection structure 180 may include a first electrical connection structure 181 and a second electrical connection structure 182. The first electrical connection structure 181 may be electrically connected to one of the source or the drain of the first selection transistor 121, and the second electrical connection structure 182 may be electrically connected to one of the source or the drain of the second selection transistor 122. In some embodiments, when the third doped region 115 is used as the source of each of the first selection transistor 121 and the second selection transistor 122, the electrical connection structure 180 may be a source contact structure configured to read out an electrical signal of the source. In some embodiments, the electrical connection structure 180 may include an electrical contact layer 183 and a conductive portion 184 that are sequentially stacked along a direction away from the substrate 100. The electrical contact layer 183 may be made of materials including, but not limited to, any one of polysilicon, silicon, tungsten, copper, or aluminum. The conductive portion 184 may be made of a metallic material including, but not limited to, at least one of tungsten, nickel, titanium, titanium nitride, tantalum nitride, aluminum, or copper.

In some embodiments, the semiconductor structure may further include two isolation structures 170 located within the substrate 100 and on the side of the third doped regions 115 away from the conductive layer 130. The isolation structures 170 may further run through the well layer 160. The isolation structures 170 may be configured to isolate the well layer 160 arranged in an array in the substrate 100 to form a semiconductor structure arranged in an array.

Figure 3:
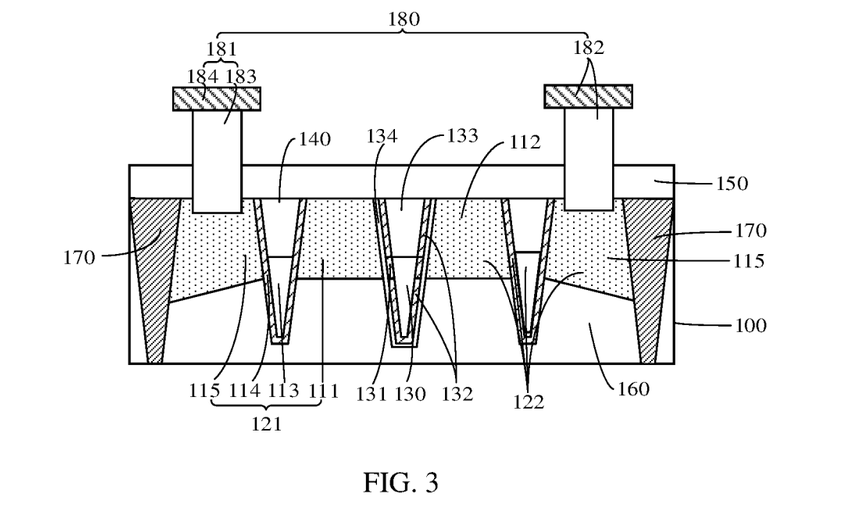
FIG. 3 is still another schematic structural diagram of a cross-sectional view of a semiconductor structure according to an embodiment of the invention.

FIG. 3 is still another schematic structural diagram of a cross-sectional view of a semiconductor structure according to an embodiment of the invention. Referring to FIG. 3, in some embodiments, the semiconductor structure may further include an oxide layer 134 located between the resistive dielectric layer 131 and the first doped region 111, and between the resistive dielectric layer 131 and the second doped region 112. In some embodiments, the substrate 100 may be a silicon substrate 100, and the resistive dielectric layer 131 may be made of a high-k dielectric material, such as any one of $HfO_2$, $Ta_2O_5$, $Al_2O_3$, or MgO. Compared with the high-k dielectric material, the oxide layer 134 and the silicon substrate 100 have better interface characteristics. Since both of the oxide layer 134 and the resistive dielectric layer 131 are made of insulating materials, the interface characteristics between the oxide layer 134 and the resistive dielectric layer 131 is relatively good. Therefore, by arranging the oxide layer 134 between the resistive dielectric layer 131 and the first doped region 111, and between the resistive dielectric layer 131 and the second doped region 112, good interface characteristics between various components of the semiconductor structure can be maintained, so as to improve the electrical characteristics of the semiconductor structure.

In addition, since the oxide layer 134 is arranged between the resistive dielectric layer 131 and the substrate 100, the interface characteristics between the resistive dielectric layer 131 and the oxide layer 134 is better than that between the resistive dielectric layer 131 and the substrate 100 in direct contact. Therefore, good resistive characteristics of the resistive dielectric layer 131 can also be maintained, which improves the data access characteristics of the two semiconductor units in the semiconductor structure. In some embodiments, the oxide layer 134 may be made of silicon oxide. In some embodiments, when the resistive dielectric layer 131 and the isolation dielectric layer 132 are integrally formed film layers, the oxide layer 134 may also be located on the sidewall of the isolation dielectric layer 132.

Figure 4:
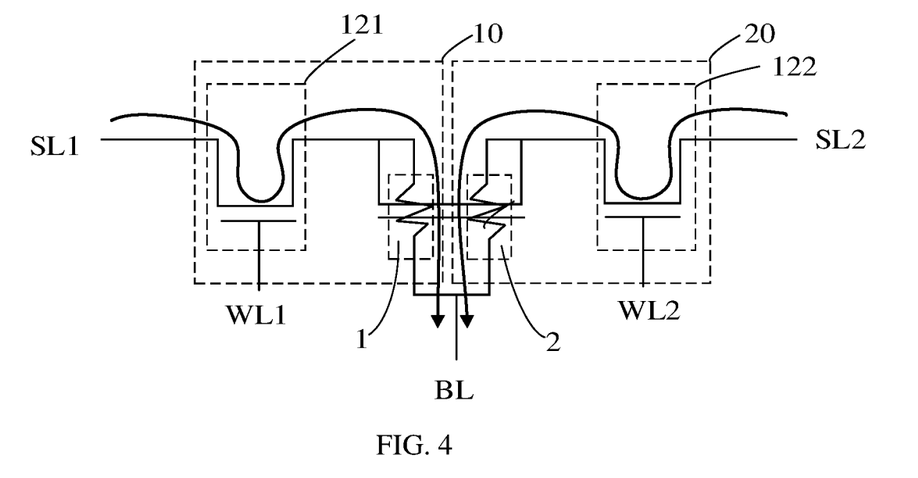
FIG. 4 is a schematic diagram of an equivalent circuit corresponding to the semiconductor structure in FIG. 1.

FIG. 4 is a schematic diagram of an equivalent circuit corresponding to the semiconductor structure in FIG. 1. Referring to FIG. 4, the storage circuit may include: the first variable resistor 1 and the second variable resistor 2 that are electrically connected; the first selection transistor 121 and the second selection transistor 122, where one of the source or drain of the first selection transistor 121 is electrically connected to one terminal of the first variable resistor 1, one of the source or drain of the second selection transistor 122 is electrically connected to one terminal of the second variable resistor 2, the first selection transistor 121 includes the first word line WL1, and the second selection transistor 122 includes the second word line WL2; the bit line, where the first variable resistor 1 and the second variable resistor 2 are both electrically connected to the bit line; and the first electrical connection structure SL1 and the second electrical connection structure SL2, where the first electrical connection structure SL1 is electrically connected to one of the source or the drain of the first selection transistor 121, and the second electrical connection structure SL2 is electrically connected to the other of the source or the drain of the second selection transistor 122. The first variable resistor 1 and the first selection transistor 121 constitute a first semiconductor unit 10, and the second variable resistor 2 and the second selection transistor 122 constitute a second semiconductor unit 20. The first semiconductor unit 10 and the second semiconductor unit 20 constitutes one storage unit.

Referring to FIG. 4, in some embodiments, the "set '1'" or "set '0'" process may be formed on the first variable resistor 1 in the storage circuit. In some embodiments, during data writing, taking the first variable resistor 1 as an example, when the first word line WL1 of the first selection transistor 121 is selected and a write voltage is applied to the first variable resistor 1 via the BL, the resistive dielectric layer 131 of the first variable resistor 1 converts to a high-resistance state or a low-resistance state based on different write voltages applied to the first variable resistor 1 via the BL. At the same time, the voltage of the first electrical connection structure SL1 is 0 or in a potential equal to that of WL1.

The process of reading data from the storage circuit is shown in Table 1:

TABLE 1

| No. | First variable resistor | Second variable resistor | Read operation | | | | |
|-----|-----|-----|-----|-----|-----|-----|-----|
| | | | SL 1 | WL 1 | BL | WL 2 | SL 2 |
| 1 | $R_H \rightarrow R_L$ | | 0V/GND | Selected | Read | Not selected | 0V/GND |
| 2 | $R_L \rightarrow R_H$ | | 0V/GND | Selected | Read | Not selected | 0V/GND |
| 3 | | $R_H \rightarrow R_L$ | 0V/GND | Not selected | Read | Selected | 0V/GND |
| 4 | | $R_L \rightarrow R_H$ | 0V/GND | Not selected | Read | Selected | 0V/GND |
| 5 | $R_H \rightarrow R_L$ | $R_H \rightarrow R_L$ | 0V/GND | Selected | Read | Selected | 0V/GND |
| 6 | $R_L \rightarrow R_H$ | $R_L \rightarrow R_H$ | 0V/GND | Selected | Read | Selected | 0V/GND |
| 7 | $R_H \rightarrow R_L$ | $R_L \rightarrow R_H$ | 0V/GND | Selected | Read | Selected | 0V/GND |
| 8 | $R_L \rightarrow R_H$ | $R_H \rightarrow R_L$ | 0V/GND | Selected | Read | Selected | 0V/GND |

Table 1 is a data read table for reading data from the storage circuit. Referring to Table 1, when reading out data, SL1 is in a zero potential or a grounded state. When WL1 is selected, because the resistive dielectric layer 131 of the first variable resistor 1 has a state of either a high-resistance state or a low-resistance state during data writing, current values read by the BL are different and thus correspond to different logic level signals. In some embodiments, when the resistive dielectric layer 131 of the first variable resistor 1 is in a low-resistance state, a high voltage may be generated accordingly, and the BL may read out a high current, thereby completing the "set '1'". When the resistive dielectric layer 131 of the first variable resistor 1 is in a high-resistance state, a low voltage may be generated accordingly, and the BL may read out a low current, thereby completing the "set '0'".

Referring to Table 1, in some embodiments, when the first word line WL1 of the first selection transistor 121 is selected and the second word line WL2 of the second selection transistor 122 is not selected, and a write voltage is applied to the first variable resistor 1, the resistive dielectric layer 131 in the first variable resistor 1 converts from a high-resistance state $R_H$ to a low-resistance state $R_L$ (the resistance in the low-resistance state $R_L$ is denoted as R1), thereby completing a data storage process (e.g., the "set '1'" process).

In some other embodiments, when the first word line WL1 of the first selection transistor 121 is selected and the second word line WL2 of the second selection transistor 122 is not selected, and a write voltage is applied to the first variable resistor 1, the resistive dielectric layer 131 in the first variable resistor 1 converts from a low-resistance state $R_L$ to a high-resistance state $R_H$ (the resistance in the high-resistance state $R_H$ is denoted as R2), thereby completing a data storage process (e.g., the "set '0'" process).

In still other embodiments, when the second word line WL2 of the second selection transistor 122 is selected and the first word line WL1 of the first selection transistor 121 is not selected, and a write voltage is applied to the second variable resistor 2, the resistive dielectric layer 131 in the second variable resistor 2 converts from a high-resistance state $R_H$ to a low-resistance state $R_L$ (the resistance in the low-resistance state $R_L$ is denoted as R3), thereby completing a data storage process (e.g., the "set '1'" process).

In yet other embodiments, when the second word line WL2 of the second selection transistor 122 is selected and the first word line WL1 of the first selection transistor 121 is not selected, and a write voltage is applied to the second variable resistor 2, the resistive dielectric layer 131 in the second variable resistor 2 converts from a low-resistance state $R_L$ to a high-resistance state $R_H$ (the resistance in the high-resistance state $R_H$ is denoted as R4), thereby completing a data storage process (e.g., the "set '0'" process).

Referring to FIG. 4, since the first variable resistor 1 and the second variable resistor 2 are electrically connected, they form a parallel connection. Therefore, in some embodiments, when both the first word line WL1 of the first selection transistor 121 and the second word line WL2 of the second selection transistor 122 are selected, and the "set '1' process" is performed on both the first variable resistor 1 and the second variable resistor 2, the resistive dielectric layers 131 in both the first variable resistor 1 and the second variable resistor 2 may convert from a high-resistance state $R_H$ to a low-resistance state $R_L$. Because the first variable resistor 1 and the second variable resistor 2 are connected in parallel, the output resistance after the first variable resistor 1 and the second variable resistor 2 are connected in parallel is less than the resistance of the first variable resistor 1 or the resistance of the second variable resistor 2, and is denoted as R5. Thus, the data storage process is completed, and the data can be read out via the bit line.

In some other embodiments, when both the first word line WL1 of the first selection transistor 121 and the second word line WL2 of the second selection transistor 122 are selected, the first variable resistor 1 may undergo the "set '1'" process, and the second variable resistor 2 may undergo the "set '0'" process. The resistive dielectric layer 131 in the first variable resistor 1 may convert from a high-resistance state $R_H$ to a low-resistance state $R_L$, and the resistive dielectric layer 131 in the second variable resistor 2 may convert from a low-resistance state $R_L$ to a high-resistance state $R_H$. Therefore, the output resistance after the first variable resistor 1 and the second variable resistor 2 are connected in parallel is less than the resistance of the first variable resistor 1 or the resistance of the second variable resistor 2 and is denoted as R6, which is different from R5. Thus, the data storage process is completed.

In still other embodiments, when both the first word line WL1 of the first selection transistor 121 and the second word line WL2 of the second selection transistor 122 are selected, the second variable resistor 2 may undergo the "set '1'" process, and the first variable resistor 1 may undergo the "set '0'" process. The resistive dielectric layer 131 in the second variable resistor 2 may convert from a high-resistance state $R_H$ to a low-resistance state $R_L$, and the resistive dielectric layer 131 in the first variable resistor 1 may convert from a low-resistance state $R_L$ to a high-resistance state $R_H$. Therefore, the output resistance after the first variable resistor 1 and the second variable resistor 2 are connected in parallel is less than the resistance of the first variable resistor 1 or the resistance of the second variable resistor 2 and is denoted as R7, which is different from R5. In some embodiments, R7 may be different from R6. Thus, the data storage process is completed.

In yet other embodiments, when both the first word line WL1 of the first selection transistor 121 and the second word line WL2 of the second selection transistor 122 are selected, and both the first variable resistor 1 and the second variable resistor 2 may undergo the "set '0'" process, the resistive dielectric layers 131 in both the first variable resistor 1 and the second variable resistor 2 may convert from a low-resistance state $R_L$ to a high-resistance state $R_H$. Because the first variable resistor 1 and the second variable resistor 2 are connected in parallel, the output resistance after the first variable resistor 1 and the second variable resistor 2 are connected in parallel is less than the resistance of the first variable resistor 1 or the resistance of the second variable resistor 2 and is denoted as R8, which is different from R5, R6, and R7. Thus, the data storage process is completed, and the data can be read out via the bit line.

In the storage circuit provided in the embodiments of the invention, there are eight possible resistance changes in one storage unit. In other words, in one storage unit of the storage circuit, eight different data can be stored, such that the storage circuit has higher storage density than existing DRAM storage circuits, in which one DRAM storage unit can store only one bit of data. Therefore, even though the size of the RRAM described herein is about three times the size of an existing DRAM, one storage unit in the semiconductor structure provided in the embodiments of the invention can store 8-bit data. For example, assuming the size of one DRAM being m square microns, in the storage circuit provided in the embodiments of the invention, the unit area used for storing 1-bit data is only m×⅜ (i.e., ⅜m square microns), while the unit area used for storing 1-bit data on the DRAM storage unit is m square microns. Thus, the storage unit in the semiconductor structure provided in the embodiments of the invention has a higher storage density.

In the semiconductor structure provided in the foregoing embodiments, the substrate 100 includes the first doped region 111 and the second doped region 112, and further includes the first selection transistor 121 and the second selection transistor 122. The conductive layer 130 is arranged between the first doped region 111 and the second doped region 112, and the resistive dielectric layer 131 is arranged on the sidewall of the conductive layer 130. In addition, the conductive layer 130, the first doped region 111, and a portion of the resistive dielectric layer 131 facing the first doped region 111 constitute the first variable resistor, and the conductive layer 130, the second doped region 112, and a portion of the resistive dielectric layer 131 facing the second doped region 112 constitute the second variable resistor. In other words, in the substrate 100, the first doped region 111 and the conductive layer 130 are used as a portion of the first variable resistor, and the second doped region 112 and the conductive layer 130 are used as a portion of the second variable resistor.

The first variable resistor and the second variable resistor share the same conductive layer 130, such that there is no need to separately form structures constituting the first variable resistor and the second variable resistor. Thus, the semiconductor structure may have a relatively small size. The first variable resistor and the first selection transistor 121, and the second variable resistor and the second selection transistor 122 constitute two semiconductor units, respectively, such that one semiconductor structure can store multiple bits of data, increasing the storage density of the memory with such a semiconductor structure.

The embodiments of the invention further present a semiconductor structure fabrication method to form the semiconductor structure described herein. The semiconductor structure fabrication method will be described below in detail with reference to the accompanying drawings.

FIGS. 5, 6, 7 and 8 are schematic structural diagrams of a semiconductor structure corresponding to the semiconductor structure fabrication method according to an embodiment of the invention.

Referring to FIGS. 5, 6, 7 and 8, the semiconductor structure fabrication method may include: providing a substrate 100; forming a first doped region 111 and a second doped region 112 within the substrate 100; forming a first selection transistor 121 and a second selection transistor 122 within the substrate 100; and forming a conductive layer 130. The conductive layer 130 may be located between the first doped region 111 and the second doped region 112.

Figure 5:
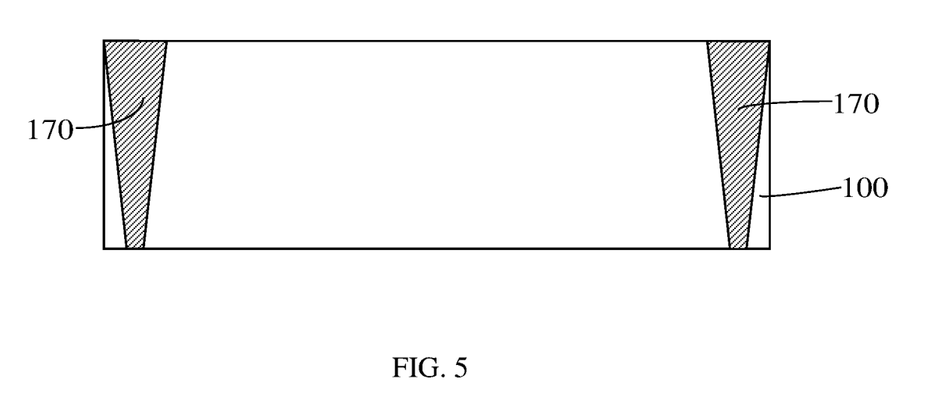
FIG. 5 is a schematic structural diagram of a substrate provided in a semiconductor structure fabrication method according to an embodiment of the invention.

FIG. 5 is a schematic structural diagram of a substrate provided in the semiconductor structure fabrication method according to an embodiment of the invention. Referring to FIG. 5, in some embodiments, the substrate 100 may be made of a semiconductor material. In some embodiments, the substrate 100 may be made of silicon. In other embodiments, the substrate 100 may also be a germanium substrate, a silicon-germanium substrate, a silicon carbide substrate, or a silicon-on-insulator substrate.

In some embodiments, the fabrication method may further include forming two isolation structures 170. The isolation structures 170 may expose a portion of the bottom surface of the substrate 100, and may be configured to form a semiconductor structure arranged in an array in the substrate 100. In some embodiments, forming the isolation structures 170 may include: patterning a surface of the substrate 100 to define an opening position of the structure; performing an etching process on the patterned surface of the substrate 100 to form an isolation trench having a predetermined depth within the substrate 100; and depositing an isolation material in the isolation trench to form the isolation trench. In some embodiments, the isolation material may be at least one of silicon oxide or silicon nitride.

Figure 6:
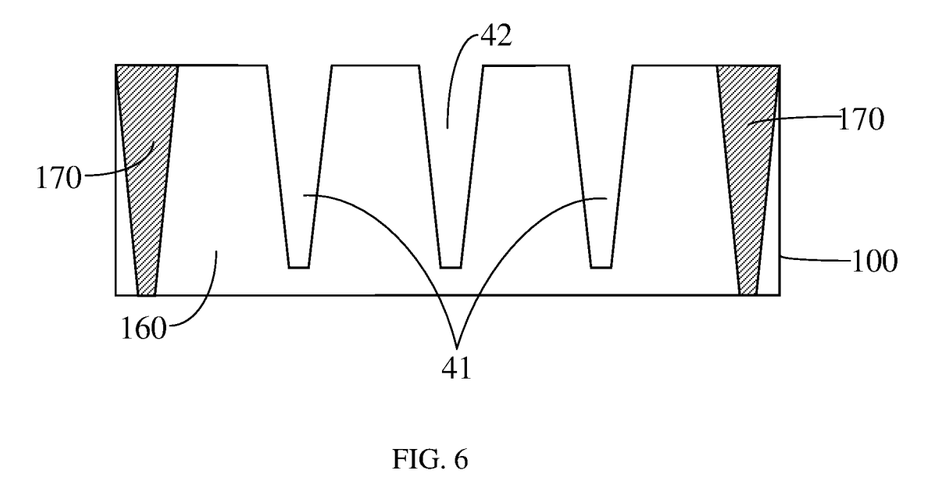
FIG. 6 is a schematic structural diagram of a semiconductor structure corresponding to forming a first trench and a second trench in a fabrication method according to an embodiment of the invention.
Figure 7:
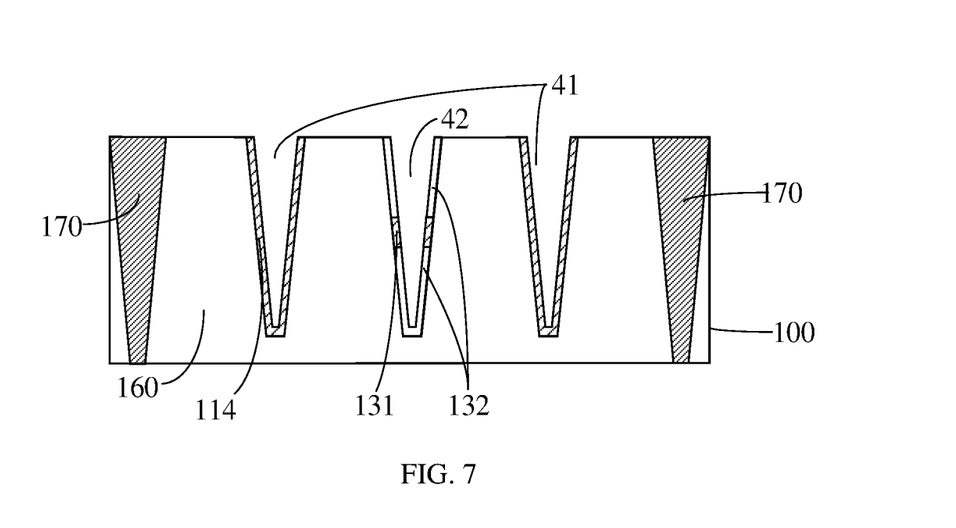
FIG. 7 is a schematic structural diagram of a semiconductor structure corresponding to forming a resistive dielectric layer and an isolation dielectric layer in a fabrication method according to an embodiment of the invention.
Figure 8:
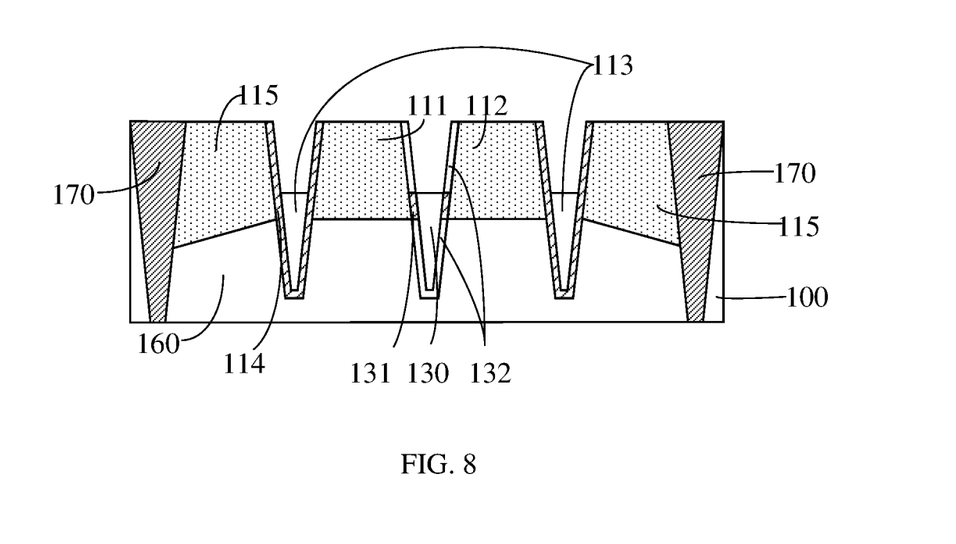
FIG. 8 is a schematic structural diagram of a semiconductor structure corresponding to forming a word line and a conductive layer in a fabrication method according to an embodiment of the invention.

Referring to FIGS. 6, 7 and 8, in some embodiments, a word line 113 of the first selection transistor 121 and a word line 113 of the second selection transistor 122 may be formed within the substrate 100. The conductive layer 130 may be formed in the process of forming the word lines 113. In other words, the word line 113 of the first selection transistor 121, the word line 113 of the second selection transistor 122, and the conductive layer 130 may be formed in the same process. The conductive layer 130 may be used as one electrode of each of the subsequently formed first variable resistor and second variable resistor. Therefore, by forming the conductive layer 130 and the word lines 113 at the same time, there is no need to separately form an electrode of the variable resistor, which greatly simplifies the fabrication process of the variable resistor. In addition, since the process of forming the word lines 113 is an existing process in the formation of a DRAM semiconductor structure, an existing mask can be used without redesigning a new mask.

FIG. 6 is a schematic structural diagram of a semiconductor structure corresponding to forming a first trench and a second trench in a fabrication method according to an embodiment of the invention. Referring to FIG. 6, before the word lines 113 are formed, the fabrication method may further include etching the substrate 100 to form first trenches 41 and a second trench 42. There may be two first trenches 41, and the first trenches 41 may be located on both sides of the second trench 42. A portion of the regions between the first trenches 41 and the second trench 42 may be used for the subsequent formation of the first doped region 111 and the second doped region 112.

In some embodiments, the method of forming the first trench 41 and the second trench 42 may include: patterning the surface of the substrate 100 to define opening positions of the first trench 41 and the second trench 42; and performing an etching process on the surface of the patterned substrate 100 to form the first trench 41 and the second trench 42 having a predetermined depth within the substrate 100.

A portion of the first trench 41 and second trench 42 may be located in a subsequently formed well layer 160, such that the resistive dielectric layers subsequently formed on the sidewall of the second trench 42 may be separated by the subsequently formed first doped region 111 and the well layer 160, and the subsequently formed second doped region 112 and the well layer 160. Thus, the resistive dielectric layers 131 are not connected to each other in doped regions having the same type of dopant ions. Therefore, the subsequently formed resistive dielectric layers 131 may be used as a portion of the first variable resistor and a portion of the second variable resistor, respectively.

FIG. 7 is a schematic structural diagram of a semiconductor structure corresponding to forming a resistive dielectric layer and an isolation dielectric layer in a fabrication method according to an embodiment of the invention. FIG. 8 is a schematic structural diagram of a semiconductor structure corresponding to forming a word line and a conductive layer in a fabrication method according to an embodiment of the invention. Referring to FIGS. 7 and 8, the resistive dielectric layer 131, the conductive layer 130, and the word lines 113 may be formed. The conductive layer 130, the first doped region 111, and a portion of the resistive dielectric layer 131 facing the first doped region 111 may constitute the first variable resistor. The conductive layer 130, the second doped region 112, and a portion of the resistive dielectric layer 131 facing the second doped region 112 may constitute the second variable resistor.

The isolation dielectric layer 132 may be formed and located between the conductive layer 130 and the substrate 100. In other words, by arranging the resistive dielectric layers 131 on the substrate 100, using the first doped region 111 and the second doped region 112 within the substrate 100 as one electrode of a variable resistor, and using the conductive layer 130 as the other electrode of a variable resistor, the first doped region 111, the second doped region 112, the resistive dielectric layer 131, and the conductive layer 130 may constitute the first variable resistor and the second variable resistor, respectively. Thus, there is no need to separately form two electrodes of the variable resistor, which greatly reduces the size of the semiconductor structure. In addition, the first variable resistor and the first selection transistor 121 (referring to FIG. 1), and the second variable resistor and the second selection transistor 122 (referring to FIG. 1) constitute two semiconductor units, respectively, such that one semiconductor structure can store multiple bits of data, thereby increasing the storage density of the memory.

Referring to FIG. 7, in some embodiments, the fabrication method may further include forming a gate dielectric layer 114 on the sidewall and the bottom of the word line 113. Referring to FIG. 8, the gate dielectric layer 114 may be located on the sidewall and the bottom of the word line 113 and may be configured to isolate the word line 113 from the substrate 100, thereby preventing ion diffusion between the word line 113 and the substrate 100.

In some embodiments, the process of forming the gate dielectric layer 114, the isolation dielectric layer 132, and the resistive dielectric layer 131 may include: forming the gate dielectric layer 114 on the bottom and the sidewall of the first trench 41; forming the isolation dielectric layer 132 on the bottom of the second trench 42, and forming the resistive dielectric layer 131 on the sidewall of the second trench 42.

In some embodiments, the gate dielectric layer 114, the resistive dielectric layer 131, and the isolation dielectric layer 132 may be formed in the same process. In other words, the gate dielectric layer 114, the resistive dielectric layer 131, and the isolation dielectric layer 132 may be made of the same material. Therefore, the gate dielectric layer 114, the resistive dielectric layer 131, and the isolation dielectric layer 132 may be integrally formed. Thus, the process of forming the resistive dielectric layer 131 may be the same as the process of forming the gate dielectric layer 114 and the isolation dielectric layer 132. Since the process of forming the gate dielectric layer 114 and the isolation dielectric layer 132 is an existing process in the formation of a DRAM semiconductor structure, the resistive dielectric layer 131 may be formed by using an existing mask for forming the DRAM semiconductor structure, thereby simplifying the fabrication process of the resistive dielectric layer 131.

Referring to FIG. 8, the word line 113 filling the first trench 41 (as shown in FIG. 7) may be formed on the surface of the gate dielectric layer 114, and the conductive layer 130 filling the second trench 42 (as shown in FIG. 7) may be simultaneously formed on the surface of the resistive dielectric layer 131 and the isolation dielectric layer 132. In some embodiments, the depths of the formed word line 113 and the conductive layer 130 in the substrate 100 may be substantially the same. That is, a portion of the formed conductive layers 130 may also be located in the well layer 160, which facilitates the simultaneous formation of the word line 113 and the conductive layer 130 and improves the efficiency in forming the word line 113 and the conductive layer 130.

In some embodiments, after the first trench 41 (as shown in FIG. 7) and the second trench 42 (as shown in FIG. 7) are formed, the first doped region 111 and the second doped region 112 may be respectively formed between the first trench 41 and the second trench 42 of the substrate 100. Thus, the first doped region 111 and the second doped region 112 may be formed in the substrate 100 by using the first trench 41 and the second trench 42 as masks, respectively. In addition, the first doped region 111 and the second doped region 112 may be respectively formed, allowing the first doped region 111 and the second doped region 112 to have different doping concentrations. The first doped region 111 and the second doped region 112 may be used as one electrode of a variable resistor, and the conductive layer 130 may be used as the other electrode of a variable resistor, and may constitute variable resistors together with the resistive dielectric layer 131. Specifically, for more efficient ion implantation, a combination of vertical implantation and oblique implantation may be used on the surface of the substrate 100 to implant ions into the substrate 100 to form the first doped region 111 and the second doped region 112.

In some embodiments, when forming the first doped region 111 and the second doped region 112, two third doped regions 115 located on both sides of the first doped region 111 and the second doped region 112 may be formed simultaneously. One of the third doped regions 115 may be used as one of the source or drain of the first selection transistor 121, and the other one of the third doped regions 115 may be used as the other one of the source or drain of the second selection transistor 122. In some embodiments, the type of dopant ions in the third doped region 115 may be the same as that of dopant ions in the first doped region 111 and the second doped region 112.

In some embodiments, before forming the first doped region 111, the second doped region 112, and the third doped regions 115, the method may further include forming a well layer 160 in the substrate 100. The type of dopant ions in the well layer 160 may be different from the type of dopant ions in the first doped region 111 and the second doped region 112, such that PN junctions can be formed between the well layer 160 and each of the first doped region 111 and the second doped region 112. In some embodiments, the well layer 160 may be formed by ion implantation.

In some embodiments, before forming the first trench 41 (as shown in FIG. 7) and the second trench 42 (as shown in FIG. 7), the first doped region 111 and the second doped region 112 may be formed in the same process. The first doped region 111 and the second doped region 112 may be connected to each other. In other words, the first doped region 111 and the second doped region 112 may be integrally formed, such that the concentrations of the first doped region 111 and the second doped region 112 are the same. This simplifies the fabrication process of the first doped region 111 and the second doped region 112.

In addition, because the first doped region 111 is used as one of the source or the drain of the first selection transistor 121, and the second doped region 112 is used as one of the source or the drain of the second selection transistor 122, the characteristics of the first selection transistor 121 and the second selection transistor 122 are similar, which improves the overall electrical characteristics of the semiconductor structure. In some embodiments, the first doped region 111 and the second doped region 112 may be doped with the same type of dopant ions. For example, the first doped region 111 and the second doped region 112 may both be doped with P-type ions or N-type ions.

The process of forming the first doped region 111 and the second doped region 112 is an existing process in the formation of a DRAM semiconductor structure. The process of forming the conductive layer 130 may be the same as the process of forming the word line 113 (i.e., an existing process in the formation of a DRAM semiconductor structure). The process of forming the resistive dielectric layer 131 may also be an existing process in the formation of a DRAM semiconductor structure. Therefore, the RRAM semiconductor structure may be formed by using the existing processes and masks in the formation of a DRAM semiconductor structure, which simplifies the fabrication process of the RRAM.

Referring to FIG. 1, in some embodiments, the fabrication method may further include forming an electrical connection structure 180 in contact with the third doped regions 115. The electrical connection structure 180 may be in contact with the substrate 100 of the third doped region 115 and may be configured to lead out an electrical signal of the third doped region 115.

In some embodiments, when using the third doped regions 115 as the source of each of the first selection transistor 121 and the second selection transistor 122, the electrical connection structure 180 may be a source leading-out structure configured to lead out an electrical signal of the source. In some embodiments, the electrical connection structure 180 may include an electrical contact layer 183 and a conductive portion 184 sequentially stacked along a direction away from the substrate 100.

In some embodiments, a method of forming the electrical connection structure may include: patterning the surface of the substrate 100 of the third doped region 115 to define an opening of the electrical contact layer 183; performing an etching process on a portion of the third doped region 115 to form a concave hole having a predetermined depth in the substrate 100 of the third doped region 115; forming the electrical contact layer 183 in the concave hole by using a deposition process, where the height of the electrical contact layer 183 is higher than the surface of the substrate 100 of the third doped region 115; and forming the conductive portion 184 on the top surface of the third doped region 115 by using a deposition process. In some embodiments, the electrical contact layer 183 may be made of materials including, but not limited to, any one of polysilicon, silicon, tungsten, copper, or aluminum. The conductive portion 184 may be made of a metallic material, such as at least one of tungsten, nickel, titanium, titanium nitride, tantalum nitride, aluminum, or copper.

In the semiconductor structure fabrication method provided in the foregoing embodiments, the resistive dielectric layer 131 is formed within the substrate 100. The conductive layer 130, the first doped region 111, and a portion of the resistive dielectric layer 131 facing the first doped region 111 constitute the first variable resistor, and the conductive layer 130, the second doped region 112, and a portion of the resistive dielectric layer 131 facing the second doped region 112 constitute the second variable resistor. By using the first doped region 111 and second doped region 112 existing in the substrate 100 as one electrode of a variable resistor, and the conductive layer 130 in the substrate 100 as the other electrode of a variable resistor, there is no need to separately form the structures in the variable resistors. On the one hand, the fabrication process is simplified. On the other hand, since there is no need to separately form variable resistors and the formed structure is relatively consistent with existing DRAM semiconductor structures, the density of the formed RRAM semiconductor structure is comparable to that of the DRAM semiconductor structure. In addition, since the structure of the first doped region 111, the second doped region 112, and the conductive layer 130 are formed using the existing processes of forming DRAM semiconductor structures, existing masks for forming the DRAM semiconductor structures may be used to fabricate the semiconductor structure in the embodiments of the invention, which simplifies the fabrication process.

Persons of ordinary skills in the art can appreciate that, the foregoing embodiments are merely exemplary embodiments for implementing the invention, and in practical applications, various changes to the form and details may be made without departing from the spirit and scope of the invention. A person skilled in the art may make various changes and modifications without departing from the spirit and scope of the invention. Therefore, the scope of protection of the invention shall be subject to the scope defined by the claims.

What is claimed is:

1. A semiconductor structure, comprising:
    a substrate, the substrate comprising a first doped region and a second doped region within the substrate;
    a first selection transistor and a second selection transistor located in the substrate;
    a conductive layer located between the first doped region and the second doped region;
    a resistive dielectric layer located on sidewalls of the conductive layer, wherein the resistive dielectric layer includes a first portion facing the first doped region and a second portion facing the second doped region, and wherein the conductive layer, the first doped region, and the first portion of the resistive dielectric layer constitute a first variable resistor, and the conductive layer, the second doped region, and the second portion of the resistive dielectric layer constitute a second variable resistor; and
    an isolation dielectric layer located between the conductive layer and the substrate.

2. The semiconductor structure of claim 1, wherein along a direction of the first selection transistor pointing to the conductive layer, a distance from the conductive layer to the first selection transistor is substantially equal to a distance from the conductive layer to the second selection transistor.

3. The semiconductor structure of claim 1, wherein the substrate further comprises: a well layer located beneath the first doped region and the second doped region, wherein a type of dopant ions in the well layer is different from a type of dopant ions in the first doped region and the second doped region, wherein a portion of the conductive layer is further located in the well layer, and the isolation dielectric layer is located between the well layer and the conductive layer.

4. The semiconductor structure of claim 1, wherein the isolation dielectric layer and the resistive dielectric layer are made of a same material and formed in a same process.

5. The semiconductor structure of claim 1, wherein a top surface of the conductive layer is lower than a top surface of the first doped region and a top surface of the second doped region, and the semiconductor structure further comprises:
    a cap layer located on the top surface of the conductive layer and within the substrate, wherein the resistive dielectric layer is further located on a side surface of the cap layer facing the first doped region and a side surface of the cap layer facing the second doped region.

6. The semiconductor structure of claim 1, wherein the first portion of the resistive dielectric layer is in contact with the first doped region, and the second portion of the resistive dielectric layer is in contact with the second doped region.

7. The semiconductor structure of claim 1, further comprising:
    an oxide layer located between the resistive dielectric layer and the first doped region, and between the resistive dielectric layer and the second doped region.

8. The semiconductor structure of claim 1, wherein the first selection transistor and the second selection transistor each comprise:
    a word line located in the substrate, wherein the word line and the conductive layer are in a same layer and are made of a same material.

9. The semiconductor structure of claim 8, wherein the first selection transistor and the second selection transistor each further comprise:
    a gate dielectric layer located on the sidewall and the bottom of the word line, wherein the gate dielectric layer and the resistive dielectric layer are made of a same material.

10. The semiconductor structure of claim 1, further comprising:
    two third doped regions located in the substrate, wherein one of the third doped regions is one of a source or a drain of the first selection transistor, and the other one of the third doped regions is the other one of a source or a drain of the second selection transistor; and
    an electrical connection structure in contact with the third doped regions.

11. The semiconductor structure of claim 1, wherein the resistive dielectric layer is made of a high-K dielectric material.

12. The semiconductor structure of claim 11, wherein the high-K dielectric material has a K value greater than 3.9.

13. A semiconductor structure fabrication method, comprising:
    providing a substrate;
    forming a first doped region and a second doped region within the substrate;
    forming a first selection transistor and a second selection transistor within the substrate;
    forming a conductive layer located between the first doped region and the second doped region;
    forming a resistive dielectric layer located on sidewalls of the conductive layer, wherein the resistive dielectric layer includes a first portion facing the first doped region and a second portion facing the second doped region, and wherein the conductive layer, the first doped region, and the first portion of the resistive dielectric layer constitute a first variable resistor, and the conductive layer, the second doped region, and the second portion of the resistive dielectric layer constitute a second variable resistor; and
    forming an isolation dielectric layer located between the conductive layer and the substrate.

14. The method of claim 13, further comprising:
    forming a word line of the first selection transistor and a word line of the second selection transistor within the substrate, wherein the conductive layer and the word lines are formed in a same process.

15. The method of claim 14, wherein before the word lines are formed, the method further comprises:
    etching the substrate to form a first trench and a second trench;
    forming a gate dielectric layer on a bottom and a sidewall of the first trench;
    forming the isolation dielectric layer on a bottom of the second trench, and forming the resistive dielectric layer on a sidewall of the second trench; and
    forming the word line filling the first trench on a surface of the gate dielectric layer, and simultaneously forming the conductive layer filling the second trench on a surface of the resistive dielectric layer and the isolation dielectric layer.

16. The method of claim 15, wherein the gate dielectric layer, the resistive dielectric layer, and the isolation dielectric layer are formed in a same process.

17. The method of claim 15, wherein before the first trench and the second trench are formed, the first doped region and the second doped region are formed in a same process, and the first doped region and the second doped region are connected.

18. The method of claim 13, wherein the resistive dielectric layer is made of a high-K dielectric material.

19. The method of claim 18, wherein the high-K dielectric material has a K value greater than 3.9.

* * * * *